United States Patent [19]

Agrawal et al.

[11] Patent Number: 4,493,077
[45] Date of Patent: Jan. 8, 1985

[54] SCAN TESTABLE INTEGRATED CIRCUIT

[75] Inventors: Vishwani D. Agrawal, New Providence; Melvin R. Mercer, Warren, both of N.J.

[73] Assignee: AT&T Laboratories, Murray Hill, N.J.

[21] Appl. No.: 416,271

[22] Filed: Sep. 9, 1982

[51] Int. Cl.$^3$ .................. G01R 31/28; G06F 11/00
[52] U.S. Cl. .................................... 371/25; 324/73 AT
[58] Field of Search ............ 371/25; 324/73 R, 73 AT

[56] References Cited

U.S. PATENT DOCUMENTS

| | | | |
|---|---|---|---|
| 3,761,695 | 9/1973 | Eichelberger | 235/153 |
| 3,783,254 | 1/1974 | Eichelberger | 235/152 |
| 3,815,025 | 6/1974 | Jordan | 324/73 R |
| 4,063,080 | 12/1977 | Eichelberger | 324/73 AT X |
| 4,074,851 | 2/1978 | Eichelberger | 235/302 |
| 4,139,818 | 2/1979 | Schneider | 324/73 R |
| 4,293,919 | 10/1981 | Dasgupta et al. | 364/716 |
| 4,298,980 | 11/1981 | Hajdu et al. | 371/25 |
| 4,435,806 | 3/1984 | Segers et al. | 371/25 |

OTHER PUBLICATIONS

Goel et al., Functionally Independent AC Test for Multi–Chip Packages, IBM Technical Disclosure Bulletin, vol. 25, No. 5, 10/82, p. 2308.
Moser, LSSD Scan Path Truncated to Minimum Length for Testing, IBM Technical Disclosure Bulletin, vol. 25, No. 12, 5/83, p. 6547.
NEC Research & Development, No. 54, Jul. 1979, "Easily Testable Design of Large Digital Circuits," pp. 49–55.
Proceedings of the 1980 IEEE Test Conference, Paper 2.2, "Application of Shift Register Approach and Its Effective Implementation," pp. 22–25.
Proceedings of 14th Design Automation Conference, Jun. 1977, "A Logic Design Structure for LSI Testability," pp. 462–468.

Primary Examiner—Jerry Smith
Assistant Examiner—Mark Ungerman
Attorney, Agent, or Firm—Arthur J. Torsiglieri

[57] ABSTRACT

A large scale sequential integrated circuit is made amenable to scan design testing by the inclusion of special multiplexing and storage circuits which respond to a pair of test control pulses to reconfigure the circuit to include one or more shift registers and to step the scan test data through the shift registers. In particular, the pair of test control pulses are applied to the two terminals to which, in normal operation, are applied the clock pulses which are used to control the storage elements and which, in such operation, are never both simultaneously high. To initiate the scan test operation, these test control pulses are made simultaneously high and the circuitry responds to such conditions.

9 Claims, 11 Drawing Figures

FIG. 10 NORMAL MODE

FIG. 11 SCAN MODE

SCAN TESTABLE INTEGRATED CIRCUIT

TECHNICAL FIELD

This invention relates to large scale integrated circuits.

BACKGROUND OF THE INVENTION

An important problem in designing and fabricating very large scale integrated circuits is the inaccessibility of many of the internal nodes and so, internal signals. This makes it difficult to discern engineering problems, debug the design, and adequately to test the circuit before it is incorporated into its system environment.

Various solutions have been proposed to solve this problem. These originally involved testing the circuit with complex input test patterns that attempted to exercise all the internal circuits and propagate the state of internal signals to the output pins of the integrated circuit chip where they could be measured. As integrated circuits become more complex, the input patterns, to do a satisfactory job, increase in length sharply; and it soon becomes economically impractical to do a thorough job of testing.

Other approaches have involved the inclusion of special circuitry which when activated makes the condition of selected internal nodes of particular interest directly available at specified pins of the chip. However, with increased circuit complexity, the number of internal nodes of particular interest grows to a point where this approach is inadequate.

One promising approach that has been developed for sequential, large-scale integrated circuits and has a number of variations is generally known as scan design. See, for example, a paper entitled "Design for Testability of the IBM System/38" by L. A. Stolte and N. C. Berglund presented at the 1979 *IEEE Test Conference,* Cherry Hill, N.J. which is in the Proceedings of this Conference, pp. 29-36. Scan design makes a digital circuit testable by providing a scan mode in which all the storage elements in the circuit, except the memory arrays, have their data inputs and outputs effectively disconnected from the combinational part of the circuit and reconnected internally to form one or more shift registers. This is accomplished typically by adding multiplexing circuits at the data inputs of the storage elements which permit switching functionally the interconnections and so the operating mode of the circuit between the normal operation and the scan mode operation. Hitherto, the switching between the two modes has involved the application of a separate scan mode switching signal to the multiplexer associated with each storage element to control its operating mode. The need to route this mode switching signal to the various multiplexers can pose problems in very large scale integrated circuits where it is important to conserve space. Accordingly, it would be advantageous to avoid the routing of this switching signal between the storage elements and so to save the space such routing requires.

SUMMARY OF THE INVENTION

Large scale sequential integrated circuits amenable to scan design generally involve storage elements which include level sensitive master latches and slave latches to which are routed at least two clock or control signals for normal mode operation. In operation, unlike the invention, the "all-clocks active" state is never used. The present invention makes use of the signal redundancy that is present in circuit clocks.

In accordance with the present invention, the conditions to initiate the scan testing mode are imposed on the standard clock terminals, from which leads are routed to storage elements, and create a new state of operation in which two terminals are simultaneously active, e.g., high. It will be convenient to discuss this mode of operation in which the two terminals to which are applied the clock signals in normal operation are both high as the two-clocks active state despite the fact that these are really control signals since they serve both to control the mode of operation as well as to clock the storage elements. Decoding capability is included in each storage element to recognize this two-clock active state and to switch the circuit to the scanning mode in which the storage elements functionally reconfigure themselves effectively into one or more shift registers and then to clock the scan mode signals through the shift registers.

In one aspect our invention may be viewed as the utilization of the two terminals, normally used for providing the timing signals for the master and slave latches of the storage elements, additionally for providing the control signals to the circuitry for switching from normal operation to scan test operation.

DETAILED DESCRIPTION

Figure 1:
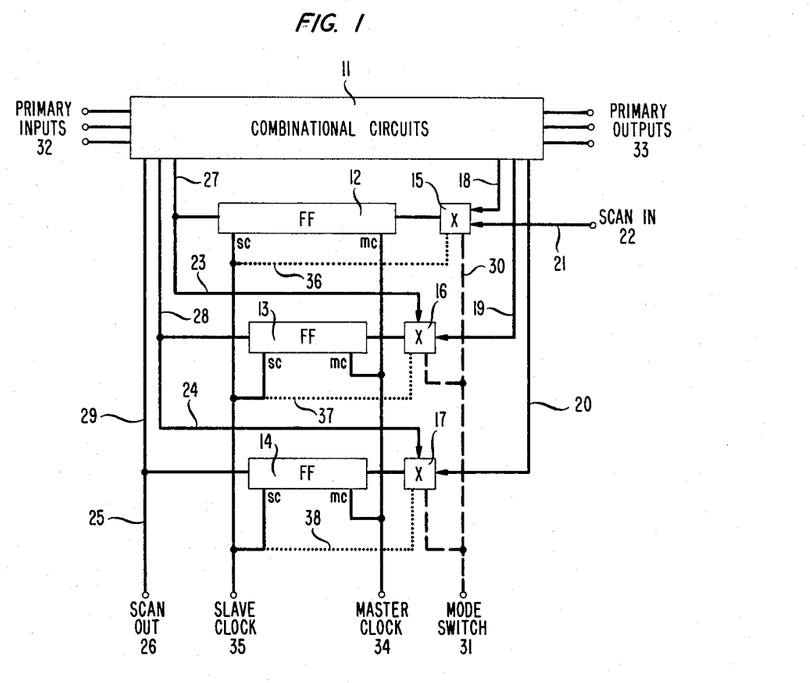
FIG. 1 shows in block diagram form a sequential integrated circuit which includes provision for scan testability either in accordance with the prior art, or in accordance with the invention to illustrate the essential differences in the two alternatives.

With the inclusion of the circuitry denoted by the broken lines and the exclusion of the portion shown by the dotted lines, FIG. 1 shows a sequential integrated circuit adapted for scan design in accordance with the prior art. With exclusion of the circuitry shown by the broken lines, the inclusion of the circuitry shown by the dotted lines and a change in the waveforms of the clock signals and in the form of the multiplexers and flip-flops included, FIG. 1 shows an illustrative example of an integrated circuit adapted for scan design in accordance with the invention.

In particular, the single combinational circuit block 11 indicates schematically the various combinational circuits included in the integrated circuit. Certain of these combinational circuit outputs will have associated with them a storage element. For purposes of exposition, only three storage elements 12, 13 and 14 are shown. These typically would be type-D flip-flops which are particularly well adapted for serial connection to form a shift register. The input to each of the flip-flops is by way of an associated multiplexer circuit 15, 16 or 17, the input of each of which includes one lead 18, 19 or 20 from the portion of the combinational circuit normally supplying the associated storage element. Additionally, the first of the multiplexers 15 includes a scan-in lead 21 by which the scan-in test signal can be applied, as desired, from the scan-in terminal 22. One input of the second multiplexer 16 is also supplied by a lead 23 from the output of the first storage element 12, and one input of the third multiplexer 17 includes a lead 24 from the output of the second storage element 13. The output of the third storage element 14 includes the lead 25 which provides an output, as appropriate, to the scan-out terminal 26. In the prior art form, the multiplexers are controlled by a signal provided by lead 30, shown by the broken line, which connects to the mode switch terminal 31 to which is applied an appropriate voltage for scan mode operation when desired. In normal mode operation, in the absence of the above voltage on terminal 31 the multiplexers pass only the information entering on leads 18, 19 and 20 and their outputs are made to pass back effectively to the appropriate portions of the combinational circuit by way of leads 27, 28 and 29.

The normal information to be processed through the circuit is supplied by the primary inputs 32 and the processed results are available at the primary outputs 33.

To move the information through the sequential circuit properly, the circuit is clocked, typically by a series of nonoverlapping master and slave clock pulses of a fixed repetition rate supplied to the master and slave latches of the flip-flop forming the storage elements. To this end, each master latch of the flip-flops is supplied by a lead from master clock terminal 34 and each slave latch by a lead from slave clock terminal 35.

When operation in the scan mode is desired, the mode switch terminal is energized and an appropriate switching voltage is applied to the multiplexers 15, 16 and 17 by way of lead 30 to cause the passage therethrough only of information supplied by leads 21, 23 and 24, respectively. As a result the output of storage element 12 is supplied by way of lead 23 to storage element 13 and its output by way of lead 24 to storage element 14 whose output is supplied by way of lead 25 to scan-out terminal 26.

This is the manner in which scan design testing typically was done in the prior art. Examples of testing systems of this kind are found in U.S. Pat. Nos. 3,761,695, 4,074,851, 3,783,254, 4,293,919 and are also described in papers appearing in *NEC Research and Development No.* 54, July 1979, pp. 49-55 entitled "Easily Testable Design of Large Digital Circuits"; in the *Proceedings of the* 1980 *IEEE Test Conference,* Paper 2.2, entitled "Application of Shift Register Approach and Its Effective Implementation"; and in the *Proceedings of* 14*th Design Automation Conference,* June 1977, pp. 462-468 entitled "A Logic Design Structure for LSI Testability." Moreover, suitable multiplexers and storage elements are described in U.S. Pat. Nos. 3,783,254 and 4,277,699.

In arrangements of this kind there is required the routing of lead 30 from the mode switch terminal 31 to each of the multiplexers and this, disadvantageously, can take up appreciable space. Additionally, the mode switch terminal 31 requires an input pin which it would be desirable to make unnecessary.

The present invention avoids the need for these elements and the circuitry can take the form shown by the solid lines in FIG. 1 with the substitution of the leads 36, 37, and 38 shown by the dotted lines for supplying the signal on the slave clock terminal 35 to the multiplexers 15, 16 and 17 for the leads supplied from the mode switch terminal 31 shown by the broken lines 30. There also needs to be modified the waveforms of the control or clock pulses and the manner in which these pulses are applied to the flip-flops. Since multiplexers 15, 16 and 17 typically can be located very close to their associated storage elements 12, 13 and 14, leads 36, 37 and 38 would require little if any additional space in physical layouts. In this last described arrangement, the level of the slave clock terminal is used to control the selection of which input to the multiplexer is to be passed to its appropriate storage element.

Figure 2:
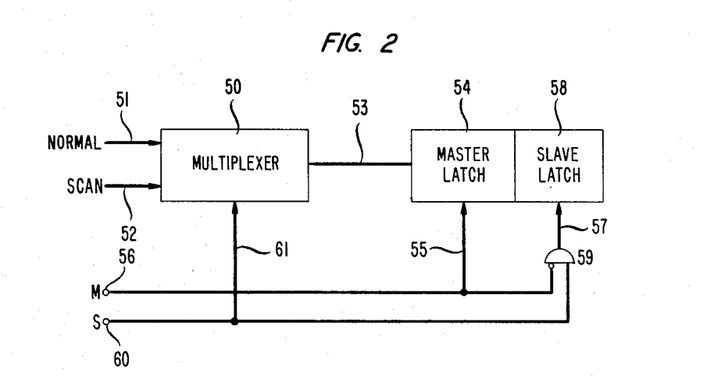
FIG. 2 shows in block diagram form a storage element which is adapted for use in the invention.

In FIG. 2, there is shown in block form in more detail the manner intended in the circuit of FIG. 1 for supplying the various multiplexers and flip-flop storage elements in the practice of our invention. The multiplexer 50 is provided with two input leads 51 and 52 for the normal and the scan signals, respectively, a selected one of which, at a given time, is to be connected to the input 53 of the master latch portion 54 of the flip-flop. The control terminal 55 of the master latch is supplied from the terminal 56 to which is applied the M control signal directly. The control terminal 57 of the slave latch portion 58 is supplied by the output of an AND circuit 59, one of whose inputs is the S control or clock signal supplied by terminal 60 and the other is the complement of the M signal supplied from the terminal 56. The S control signal is also supplied to the control terminal 61 of the multiplexer.

Figure 3:
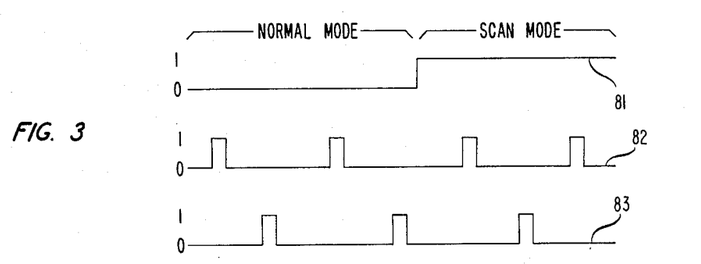
FIG. 3 shows the waveforms of the relevant control pulses in prior art scan design operation.

In FIG. 3, there are shown the waveforms of the mode switching and clock signals that would be supplied in the prior art forms of circuits adapted for scan design testability. Waveforms 81, 82 and 83 correspond, respectively, to the mode switching signal, the master clock signal and the slave clock signal. During the normal mode, the mode switching signal 81 is low. The mode switching signal 81 is high during scan operation. The waveforms of the signals supplied to the control terminals of the master and slave latches are simply nonoverlapping pulses.

In accordance with our invention, the mode switch terminal 31 is eliminated along with the leads to the multiplexers associated with it; and, instead, control of the switching to the scan mode is achieved by applying special signals to the two terminals normally used for the master and slave clock pulses, and including decoding circuitry which recognizes these special signals and derives from them the signal used by the multiplexer to control the mode of operation and the signals used by the flip-flop to control the master and slave latches.

Figure 4:
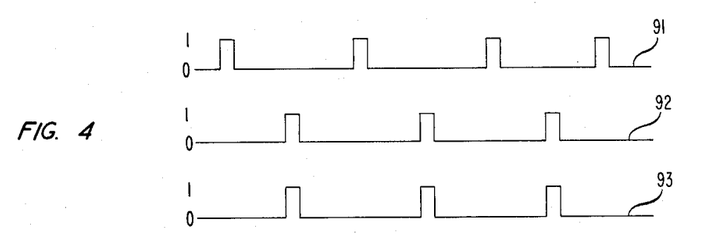
FIGS. 4 and 5 show the waveforms of the relevant control pulses in scan design testing in accordance with the invention.

In FIG. 4 there are shown the relevant waveforms involved during normal operation in a circuit in accordance with the embodiment of the invention illustrated in FIG. 2. Waveform 91 is the M signal supplied at the terminal 56 and will be the signal supplied to the control terminal 55 of the master latch and its complement to the AND circuit 59. Similarly, waveform 92 is the S signal supplied at the terminal 60, and it will also be the signal applied to the control terminal 61 of the multiplexer and to the AND circuit 59. When it is low, the multiplexer will pass normal data from the combinational circuit to the flip-flops, and when it is high, the multiplexer will pass the scan data. Waveform 93 is the output of the AND circuit 59 and is applied to slave latch control terminal 57 during this normal mode of operation. As can be seen, this waveform 93 matches the waveform 92 because the M signal is inverted.

Figure 5:
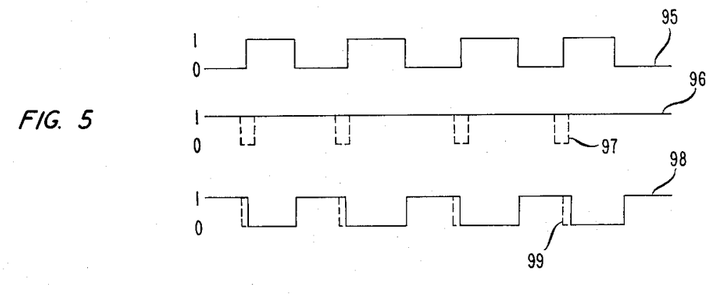

In FIG. 5 there are shown the relevant waveforms involved during scan operation in the same arrangement. Waveform 95 is the M signal supplied at the clock terminal 56 and whose complement is supplied to the AND circuit 59, and comprises a series of pulses much the same as during normal operation, and these serve primarily to control the clocking of the latches. In this scan mode of operation it is usually desirable to have the pulse width substantially correspond to the space between pulses. Waveform 96 is the S signal supplied at the clock terminal 60 and remains high. In this respect, this is a marked departure from previous practice. In some instances to ensure that the slave latch is turned off completely before the master latch goes on, it may prove desirable to set it low temporarily, as depicted by the broken lines 97, just before the time that the waveform 95 goes high. However, it should be high during the remaining portion of the time that the waveform 95 is high. Various circuits are available to a worker in the art to accomplish this. This waveform 96 is also the S signal supplied to the control terminal 61 of the multiplexer 50 and to the AND circuit 59. The multiplexer will pass scan data into the flip-flop while this signal is high. Waveform 98 is the signal at the output of the AND circuit 59 and is applied to the control terminal 57 of the slave latch. If waveform 96 includes the dotted portions 97, waveform 98 will similarly include the dotted portions 99. When the various flip-flops are interconnected in shift register form as is characteristic of the scan mode, waveforms 95 and 98, which look like normal clocking signals applied to the flip-flops, will shift the signals stored therein in the usual manner.

Figure 6:
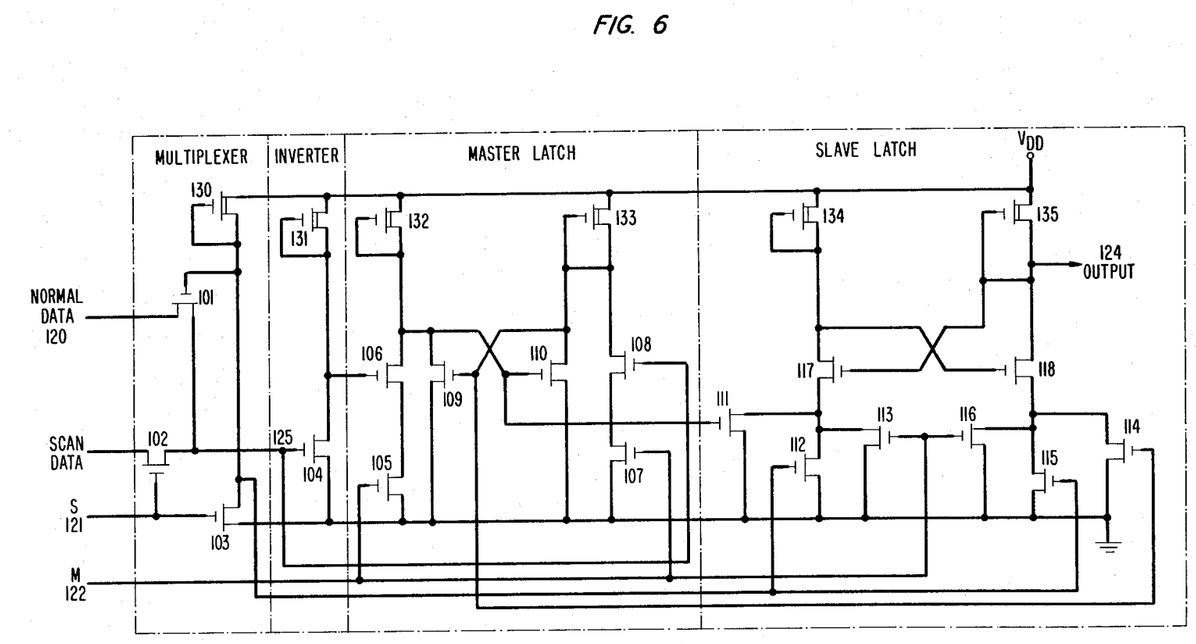
FIG. 6 shows a circuit diagram of an illustrative storage element for practice of the invention.
Figure 7:
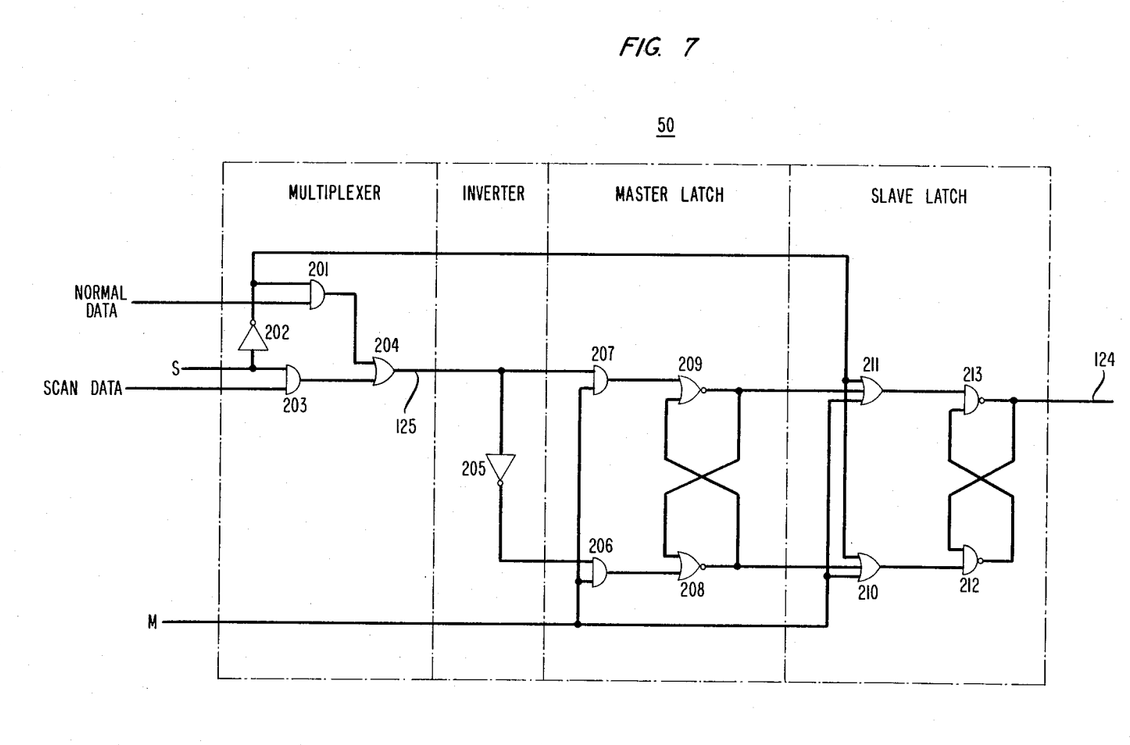
FIG. 7 is the logic gate equivalent of the circuit shown in FIG. 6.

FIG. 6 is a circuit schematic and FIG. 7 is a functionally equivalent logic diagram of the circuit arrangement shown in block schematic in FIG. 2.

In the circuit schematic all the transistors except those shown connected as diodes for use as load elements are n-type enhancement mode transistors while such load elements 130 through 135 are n-type depletion mode transistors.

Comparing first FIG. 6 with FIG. 2, transistors 101, 102, 103 and 130 essentially form the multiplexer 50 which determines whether normal data or scan data is to be supplied to the flip-flop. Transistors 104 and 131 form an inverter which is part of the master latch 54, the remainder of which essentially is formed by transistors 105 through 110 and the loads 132 and 133. The transistors 111 through 118 and loads 134 and 135 form the slave latch 58 of which transistors 113 and 116 also serve to provide the AND function indicated by 59. The inclusion of transistors 113 and 116 distinguishes this flip-flop from the usual form.

Comparing FIG. 6 now with FIG. 7, transistor 101 is a transmission gate for normal data provided at terminal 120 under control of the complement of the S clock provided at terminal 121. Transistor 103 and the load 130 serve as an inverter to provide th desired complement of the S clock. Transistor 102 similarly is a transmission gate to control passage of the scan data under control of the S clock. In the logic diagram these are shown as the ANDs 201, 203, the inverter 202 and the OR 204 which provide the desired multiplexing function. In particular, the value of the S clock will determine which of transistors 101 or 102 is conducting at a particular time. Node 125 shown in FIGS. 6 and 7 is the output of the multiplexer and is loaded with normal data when the S clock is low and the scan data when the S clock is high.

Transistor 104 and load 131 serve as inverter 205 to provide the complement of the signal available at node 125 where such complement is desired. Transistors 105 and 106 form the AND 206, and transistors 107 and 108 form the AND 207; and cross-coupled transistors 109 and 110 form the NORs 208 and 209 in the logic diagram where ANDs 206, 207, NORs 208 and 209 and inverter 205 form the master latch 54. Load 132 is common to AND 206 and NOR 208 and load 133 is common to AND 207 and NOR 209. The M clock provided at terminal 122 serves as one input to each of ANDs 206 and 207 so that when the M clock is low, the state of the master latch remains unchanged. If the M clock is high, then the master latch can change states and becomes dependent on the state at node 125.

Transistors 111, 112 and 113 are equivalent to the OR 210 and transistors 114, 115 and 116, the OR 211. Cross-coupled transistors 117 and 118 serve as the NANDs 212 and 213, respectively. ORs 210 and 211 and NANDs 212 and 213 form the slave latch. The OR 210 has as input the M clock, the complement of the S clock and the output of NOR 208. The OR 211 has as inputs the M clock, the complement of the S clock and the output of NOR 209. Transistor 134 serves as a common load for OR 210 and NAND 212 and transistor 135 serves as a common load for OR 211 and NAND 213.

While the controls, the M clock and S clock, are both low, the states of both the master and slave latches remain unchanged. When the M clock becomes high while the S clock is low, transistor 101 is turned on and normal data passes through to node 125 for subsequent inversion by transistor 104. Because the M clock is high, transistors 105 and 107 are on, so that the normal data is latched in the master latch. The established value for the master latch will be held even after the M clock turns low.

When both the M and S clocks are high, transistor 102 is on because of the effect of the S clock while transistor 101 is off. This allows scan data to pass through to node 125 for subsequent inversion by transistor 104. Again because the M clock is high, transistors 105 and 107 are on so that scan data can be latched into the master latch. The established state for the master latch will be held even after the M clock returns to low.

It can be noted that the master latch state can change only when the M clock is high whereas the slave latch state can change only when the M clock is low and the S clock is high. In the latter case, the state of the master latch is copied in the slave latch.

The scan testing operation is in the usual fashion as is described in the aforementioned prior art references relating to scan testability. The control sequence of processing in the scan data mode is as follows. With both clocks low, there is no activity. With the M clock high and the S clock low, invalid normal data enters the master latch. However, when both clocks go high, valid scan data replaces the invalid data in the master latch and when the M clock goes low while the S clock is high, the scan data in the master latch passes into the slave latch and is available at the output so that one shift of data is complete. When the M clock goes back to high, while the S clock is still high, the next bit of scan data is supplied to the master latch; and when the M clock returns to low while the S clock remains high, a second shift of data occurs to the slave latch. This operation is continued as necessary to load and shift out the entire scan register contents which will depend on the number of stages in the shift register formed by the successive serially connected flip-flops.

It should be apparent that the invention is not dependent on the particular details of the flip-flops employed so long as they are amenable to integration with multiplexing and decoding circuitry to provide the desired functions as described. In particular, it is feasible to use as a storage element a flip-flop which is partially integrated with the combinational circuit for normal mode operation and so does not have conventional separate master and slave latch portions. However, for scan mode operation for effective interconnection into a shift register, it is advantageous that the reconfiguration for the scan mode effectively results in master and slave latch portions for each storage element. Moreover, in some instances it may prove desirable to avoid excessively long shift registers and to reconfigure for scan testing the various storage elements into two or more shift registers, each with a different part of the total combinational circuitry on the chip.

Moreover in some instances, it may be desirable to insert the scan data to be used for testing on conveniently available input pins that in normal operation serve for the introduction of other signals. This can be done by associating, with such pins, multiplexing circuitry under control of the clock signals; whereby, in normal operation, the pins serve in their assigned roles where, in the scan testing mode, the scan test data applied thereto are supplied to the input ends of the shift registers formed for the scan testing operation.

It has been assumed for the purposes of the specifications that the latches accept data when their control signals are "high." It is, of course, feasible to design latches which accept data when their control signals are low. For purposes of the claims, it will be convenient to designate "active" the state in which the latches accept data and as "inactive" states in which the latches do not accept data.

Figure 8:
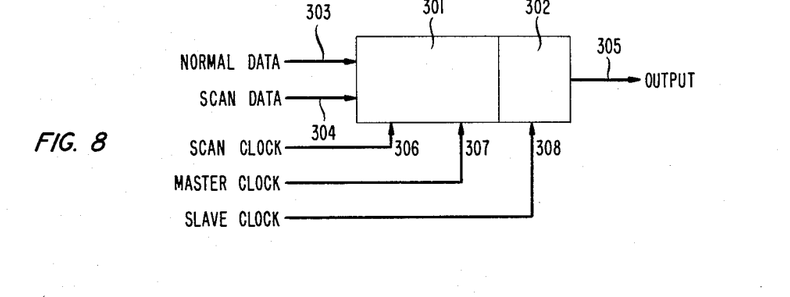
FIG. 8 shows a prior art arrangement for controlling a storage element for use in scan testing.

Our technique of using only two primary signals to control scan design testing can be extended to a scan design structure of the kind described in a paper entitled "A Logic Design Structure for LSI Testability" by E. B. Eichelberger and T. W. Williams which was published in the *Journal of Design Automation and Fault Tolerant Computing*, Vol. 2, pp. 165-178, May 1978, published by Computer Science Press, Inc. In FIG. 8 there is shown in block diagram form the basic storage element of this prior art structure for use with combinational circuitry in the manner discussed in connection with FIG. 1. It comprises a special shift register latch made up of a first polarity hold latch 301 and a second polarity hold latch 302.

As described in that paper a shift register latch (SRL) consists of two polarity hold latches (PHL). A polarity hold latch has two input signals of which one serves as a control signal and the other serves as an excitation signal. When the control signal is low or inactive, the latch cannot change state. When the control signal is high or active, the internal state of the latch is set to the value of the excitation signal. The first latch 301 is provided with two excitation signal terminals to one of which (303) is supplied normal data and to the other of which (304) is supplied scan data. The output of latch 301 will serve in turn as the excitation input of companion latch 302 of the shift register latch and an output will be available at terminal 305 of the second latch. The scan clock which is activated when scan data is to be used as the excitation input is applied to the first latch by way of terminal 306. This assembly serves the multiplexing role shown separately in the FIG. 2 embodiment. Additionally the master clock signal which serves as another control signal of the first latch is applied by way of terminal 307 and the slave clock signal which serves as the control signal for the second latch is applied by way of terminal 308. In essence three primary signals are used to control the shift register latch and each will need to be routed to each shift register latch.

In operation, when the scan clock remains low, only normal data is available at the first latch and it is shifted through the shift register latch in normal fashion under control of the master and slave clocks. Alternatively, when the master clock is held low, only scan data is available to the first latch portion, and this data is shifted through the shift register latch under control of the scan and slave clocks.

Figure 9:
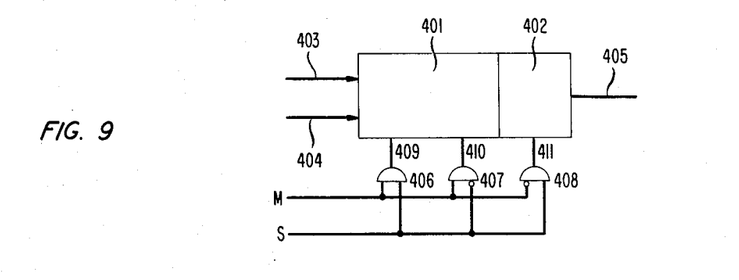
FIG. 9 shows the preceding arrangement modified in accordance with our invention.

In FIG. 9, there is shown an alternative arrangement in accordance with our invention for achieving the same results with only two primary control signals M and S, which need to be routed to each shift register latch. This arrangement similarly includes a shift register latch which includes a first latch portion 401 and a second latch portion 402, and to which are supplied normal data by way of input terminal 403 and scan data by way of input terminal 404 for passage therethrough to output terminal 405. The M primary signal has its true value applied as one input to each of AND gates 406 and 407 and its complement to AND gate 408. The S primary signal has its true value applied as an input to each of AND gates 406 and 408 and its complement to AND gate 407. The output of gate 406 is applied to control terminal 409 of latch 401 as scan clock. The output of gate 407 is applied to the control terminal 410 of the first latch 401 as master clock, and and the output of gate 408 is applied to control terminal 411 of the second latch 402 as the slave clock.

Figure 10:
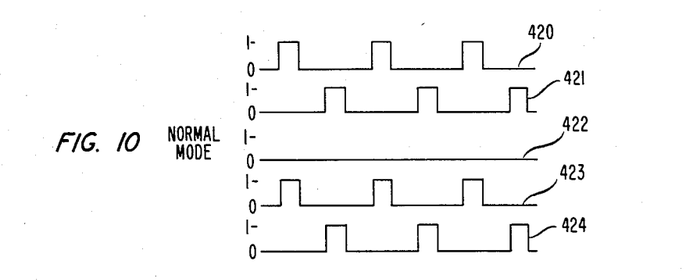
FIGS. 10 and 11 show the waveforms of the control signals used in the arrangements of FIG. 9 for the normal mode and the scan mode, respectively.

FIG. 10 illustrates the waveforms of the various signals involved in the arrangement of FIG. 9 when normal mode operation is desired. The M signal shown as waveform 420 and the S signal shown as the waveform 421 are regular nonoverlapping pulses; the waveform 422 at the output of AND gate 406 remains low; and the waveforms 423 and 424 available at the outputs of gates 407 and 408 correspond to waveforms 420 and 421, respectively.

Figure 11:
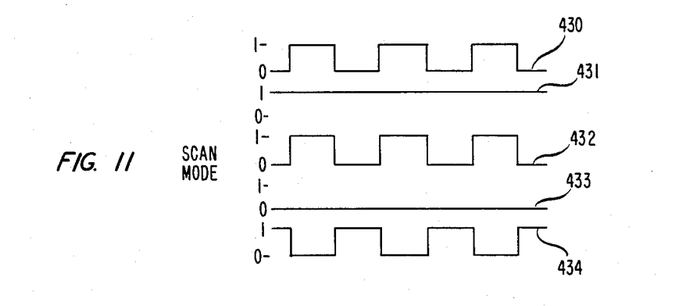

FIG. 11 illustrates the waveforms of the various signals when scan test operation is desired. The M signal is made to have the waveform 430 which advantageously is a series of pulses whose width approximates their spacing. The S signal remains uniformly high as shown by waveform 431. As a result, the output of gate 406, shown as waveform 432, corresponds to waveform 430. The output of gate 407, shown as waveform 433, remains uniformly low. The output of gate 408, shown as waveform 434, will be the complement of waveform 430.

In essence, with these waveforms available for control of the shift register latch, the operation is essentially the same as described for the embodiment shown in FIG. 2.

What is claimed is:

1. An integrated circuit adapted for scan testing and including combinational logic and storage elements normally interconnected for processing normal input data under control of a pair of control signals of which normally only one is active at a given time, comprising means responsive to a condition when both said control signals are active effectively to disconnect the storage elements from the associated combinational logic and to reconfigure the storage elements into one or more shift registers, and means for applying scan test data into said one or more shift registers and for passing such data therethrough for detection at an output.

2. An integrated circuit in accordance with claim 1 in which a pair of clock control pulses controls the processing of data of which normally only one is high at a given time, comprising means responsive to both clocks being high for disconnecting the storage elements from the associated combinational logic and for reconfiguring the storage elements into one or more shift registers.

3. An integrated circuit adapted for scan testing and including combinational logic and flip-flops normally interconnected for processing normal input data, each flip-flop including a master latch and a slave latch normally under control of a master clock and a slave clock, respectively, the two clocks normally nonoverlapping in their active states, comprising means responsive to the condition when both clocks are active effectively to disconnect the flip-flops from the associated combinational logic and to reconfigure the flip-flops into one or more shift registers, and means for applying scan test data into said shift registers and for passing such data therethrough for detection at an output when both clocks are active.

4. An integrated circuit in accordance with claim 3 in which each flip-flop is a type-D flip-flop.

5. An integrated circuit adapted for scan testing comprising combinational circuit means interconnected with storage circuit means for providing a prescribed sequence of processing steps on normal input data, circuit means activated by control pulses for recognizing the condition when a prescribed pair of control pulses is nonoverlapping and then providing operation in accordance with the prescribed sequence for normal input data and also recognizing the condition when a prescribed pair of the control pulses is overlapping for then reconfiguring the storage circuit means for effectively interconnecting the storage means into a shift register means, and means for applying scan test data into said shift register means for passage thereto and detection as an output during said last-mentioned condition.

6. A scan testable integrated circuit including a multiplexing means supplied with input normal data to be processed and input scan data for testing for controllably supplying one of the two types of data at its output, flip-flop means including a master latch portion and a slave latch portion supplied with the output of the multiplexing means, means for supplying a first clock signal and means for supplying a second clock signal, means for supplying the second clock signal to the multiplexing means for its control, means for supplying the first clock signal for controlling the master latch portion of the flip-flop, AND circuit means supplied with the second clock signal and the complement of the first clock signal for providing an output for controlling the slave latch portion of the flip-flop whereby when the first clock signal is inactive normal data is applied to the master latch of the flip-flop from the multiplexing means for transfer to the slave latch as soon as the second clock signal goes active, and when the second clock signal is inactive, scan data is applied to the master latch for transfer to the slave latch when the first clock signal goes active.

7. A scan testable integrated circuit including combinational circuit means and storage circuit means effectively configured under the control of applied signals either in a normal mode for sequentially processing input normal data or in a scan mode in which the storage circuit means are effectively configured as a shift register for shifting therethrough input test data comprising a multiplexing means supplied at one input with the normal data and at another input with test data for supplying the selected data as an output, flip-flop means including a master latch portion an a slave latch portion, means providing a first clock signal and means providing a second clock signal, means for applying the second clock signal to the multiplexing means for supplying to the input of the flip-flop from the multiplexing circuit normal data when the second clock is in a first state and the test data when the second clock is in a second state, and means supplied with both the first and second clock pulses for providing control pulses to the flip-flop means when both are active for controlling data flow to the master and slave latches.

8. A scan testable integrated circuit comprising a plurality of combinational logic circuits, a plurality of storage elements including first and second latch portions, controllable multiplexing means for either effectively interconnecting the two pluralities into an integrated circuit for processing normal data or effectively interconnecting only the plurality of storage elements into a shift register for shifting therethrough test data, means for supplying a pair of clock signals of which the active state of the first interconnects the plurality of storage elements into a shift register and the inactive state of the first interconnects the two pluralities into an integrated circuit, and means supplied with both clock pulses for deriving control pulses when both are active for the first and second latch portions for effectively transferring data into and out of said storage elements.

9. Apparatus for testing an integrated circuit of the type comprising an array of storage elements (12, 13, 14) and combinational circuits (11), means (34, 35) for applying first and second clock signals to the storage elements, only one of the clock signals being active at a given time during normal operation, said apparatus including means (15, 16, 17) for disconnecting the storage elements from the combinational logic and reconfiguring the storage elements into one or more shift registers, means (22) for applying scan test data to the reconfigured elements, and means (26) for providing a test output signal indicative of defects in the storage elements, characterized by
means for applying selectively during scan mode operation to the storage elements two control signals which are simultaneously active and characterized in that the disconnecting and reconfiguring means is responsive to the control signals being simultaneously active to reconfigure the storage elements to shift registers for test purposes and the storage elements are responsive to the two control signals to step scan test data through said shift registers.

* * * * *

UNITED STATES PATENT AND TRADEMARK OFFICE
CERTIFICATE OF CORRECTION

PATENT NO. : 4,493,077
DATED : January 8, 1985
INVENTOR(S) : Vishwani D. Agrawal and Melvin R. Mercer It is certified that error appears in the above-identified patent and that said Letters Patent is hereby corrected as shown below:

In the title page, the Assignee "AT&T Laboratories" should read --AT&T Bell Laboratories--. Column 3, line 38, "flip-flop" should read --flip-flops--. Column 5, line 65, "th" should read --the--. Column 6, line 60, "of" should read --for--. Column 7, line 57, change the comma to a period. Column 8, line 8, "assembly" should read --essentially--.

Signed and Sealed this

Fourth Day of June 1985

[SEAL]

Attest:

DONALD J. QUIGG

Attesting Officer     Acting Commissioner of Patents and Trademarks